(12) United States Patent
Kwon et al.

(10) Patent No.: US 8,816,344 B2
(45) Date of Patent: Aug. 26, 2014

(54) THIN-FILM TRANSISTOR AND ORGANIC LIGHT-EMITTING DISPLAY DEVICE INCLUDING THE SAME

(75) Inventors: Do-Hyun Kwon, Yongin (KR); Il-Jeong Lee, Yongin (KR); Choong-Youl Im, Yongin (KR); Ju-Won Yoon, Yongin (KR)

(73) Assignee: Samsung Display Co., Ltd. (KR)

( * ) Notice: Subject to any disclaimer, the term of this patent is extended or adjusted under 35 U.S.C. 154(b) by 50 days.

(21) Appl. No.: 13/099,274

(22) Filed: May 2, 2011

(65) Prior Publication Data

US 2012/0138933 A1 Jun. 7, 2012

(30) Foreign Application Priority Data

Dec. 6, 2010 (KR) ........................ 10-2010-0123475

(51) Int. Cl.
*H01L 51/50* (2006.01)
*H01L 27/12* (2006.01)

(52) U.S. Cl.
USPC ............... 257/59; 257/72; 257/347; 257/350; 257/E51.018; 257/E27.112; 438/29

(58) Field of Classification Search
USPC .......................... 257/72, 59, 350, 347; 438/29
See application file for complete search history.

(56) References Cited

U.S. PATENT DOCUMENTS

| | | | | |
|---|---|---|---|---|
| 6,724,011 B2* | 4/2004 | Segawa et al. | .................. | 257/72 |
| 7,022,556 B1* | 4/2006 | Adachi | .......................... | 438/149 |
| 8,076,741 B2* | 12/2011 | Lai et al. | ....................... | 257/431 |
| 8,164,547 B2* | 4/2012 | Kimura | .......................... | 345/76 |
| 2006/0118869 A1 | 6/2006 | Lan et al. | | |
| 2007/0090365 A1* | 4/2007 | Hayashi et al. | .................. | 257/72 |
| 2007/0290200 A1* | 12/2007 | Asano | .............................. | 257/40 |
| 2008/0316410 A1* | 12/2008 | Fujii et al. | ..................... | 349/139 |
| 2009/0195148 A1* | 8/2009 | Lee et al. | ...................... | 313/504 |
| 2009/0206332 A1 | 8/2009 | Son et al. | | |

FOREIGN PATENT DOCUMENTS

| KR | 2007-0107677 A | 11/2007 |
|---|---|---|
| KR | 1020090084642 | 8/2009 |
| KR | 1020100059586 | 6/2010 |

* cited by examiner

*Primary Examiner* — Lex Malsawma
*Assistant Examiner* — Sheng Zhu
(74) *Attorney, Agent, or Firm* — Knobbe Martens Olson & Bear LLP

(57) ABSTRACT

A thin-film transistor includes a structure for protecting an active layer, and an organic light-emitting display device including the thin-film transistor. The thin-film transistor includes: a gate electrode disposed on a substrate; a first insulating layer disposed on the gate electrode; an active layer disposed on the first insulating layer, and corresponding to the gate electrode; a second insulating layer disposed on the first insulating layer and covering the active layer, the second insulating layer including first and second openings exposing first and second portions of the active layer, respectively; a source electrode disposed on the second insulating layer and connected to the first portion of the active layer via the first opening of the second insulating layer; a drain electrode disposed on the second insulating layer and connected to the second portion of the active layer via the second opening of the second insulating layer; and a dummy member disposed on the second insulating layer and corresponding to at least a third portion of the active layer between the first and second portions of the active layer.

5 Claims, 4 Drawing Sheets

THIN-FILM TRANSISTOR AND ORGANIC LIGHT-EMITTING DISPLAY DEVICE INCLUDING THE SAME

CROSS-REFERENCE TO RELATED APPLICATIONS

This application claims the benefit of Korean Patent Application No. 10-2010-0123475, filed on Dec. 6, 2010, in the Korean Intellectual Property Office, the disclosure of which is incorporated herein by reference.

BACKGROUND

1. Field

The present disclosure relates to a thin-film transistor and an organic light-emitting display device, and more particularly, to a thin-film transistor with an improved protection structure for an active layer, and an organic light-emitting display device including the thin-film transistor.

2. Description of the Related Technology

Organic light-emitting display devices, which are recently drawing attention, typically include a thin-film transistor (TFT) and an organic light-emitting device. The organic light-emitting device receives a driving signal from the TFT, thereby emitting light and forming a desired image.

In forming an active layer of the TFT, there have been widely used amorphous oxide semiconductors with good uniformity that do not require a crystallization process.

However, due to water or oxygen, the active layer formed from such an oxide semiconductor may experience serious functional degradations. Therefore, there is a need to protect the active layer from water or oxygen to prevent such functional degradation.

SUMMARY OF THE CERTAIN INVENTIVE ASPECTS

Embodiments provide a thin-film transistor having an improved structure for protecting an active layer from functional degradation due to penetration of water or oxygen, and an organic light-emitting display device including the thin-film transistor.

According to one aspect, there is provided a thin-film transistor including: a gate electrode disposed on a substrate; a first insulating layer disposed on the gate electrode; an active layer disposed on the first insulating layer, and corresponding to the gate electrode; a second insulating layer disposed on the first insulating layer and covering the active layer, the second insulating layer comprising first and second openings respectively exposing first and second portions of the active layer; a source electrode disposed on the second insulating layer and connected to the first portion of the active layer via the first opening of the second insulating layer; a drain electrode disposed on the second insulating layer and connected to the second portion of the active layer via the second opening of the second insulating layer; and a dummy member disposed on the second insulating layer and corresponding to at least a third portion of the active layer between the first and second portions of the active layer.

The dummy member may include a metal.

The dummy member may include a same material as at least one of the source electrode and the drain electrode.

The dummy member may extend from at least one of the source electrode and the drain electrode.

The dummy member may be separated from the source electrode and the drain electrode.

The third portion may include a channel region of the active layer, and the dummy member may cover the channel region of the active layer.

The active layer may include an oxide semiconductor.

The dummy member and at least one of the source electrode and the drain electrode may be coplanar.

According to another aspect, there is provided an organic light-emitting display device including a thin-film transistor and an organic light-emitting device, wherein the thin-film transistor includes: a gate electrode disposed on a substrate; a first insulating layer disposed on the gate electrode, an active layer disposed on the first insulating layer and corresponding to the gate electrode; a second insulating layer disposed on the first insulating layer and covering the active layer, the second insulating layer comprising first and second openings respectively exposing first and second portions of the active layer; a source electrode disposed on the second insulating layer and connected to the first portion of the active layer via the first opening of the second insulating layer; a drain electrode disposed on the second insulating layer and connected to the second portion of the active layer via the second opening of the second insulating layer; and a dummy member disposed on the second insulating layer and corresponding to at least a third portion of the active layer between the first and second portions of the active layer, and the organic light-emitting device is electrically connected to the source electrode or the drain electrode.

The dummy member may include a metal.

The dummy member may include a same material as at least one of the source electrode and the drain electrode.

The dummy member may extend from at least one of the source electrode and the drain electrode.

The dummy member may be separated from the source electrode and the drain electrode.

The third portion may include a channel region of the active layer, and the dummy member may cover the channel region of the active layer.

The active layer may include an oxide semiconductor.

The dummy member and at least one of the source electrode and the drain electrode may be coplanar.

BRIEF DESCRIPTION OF THE DRAWINGS

The above and other features and advantages of the present invention will become more apparent by describing in detail certain embodiments thereof with reference to the attached drawings in which.

DETAILED DESCRIPTION OF CERTAIN INVENTIVE EMBODIMENTS

The present invention will now be described more fully with reference to the accompanying drawings, in which certain embodiments of the invention are shown.

Figure 1:
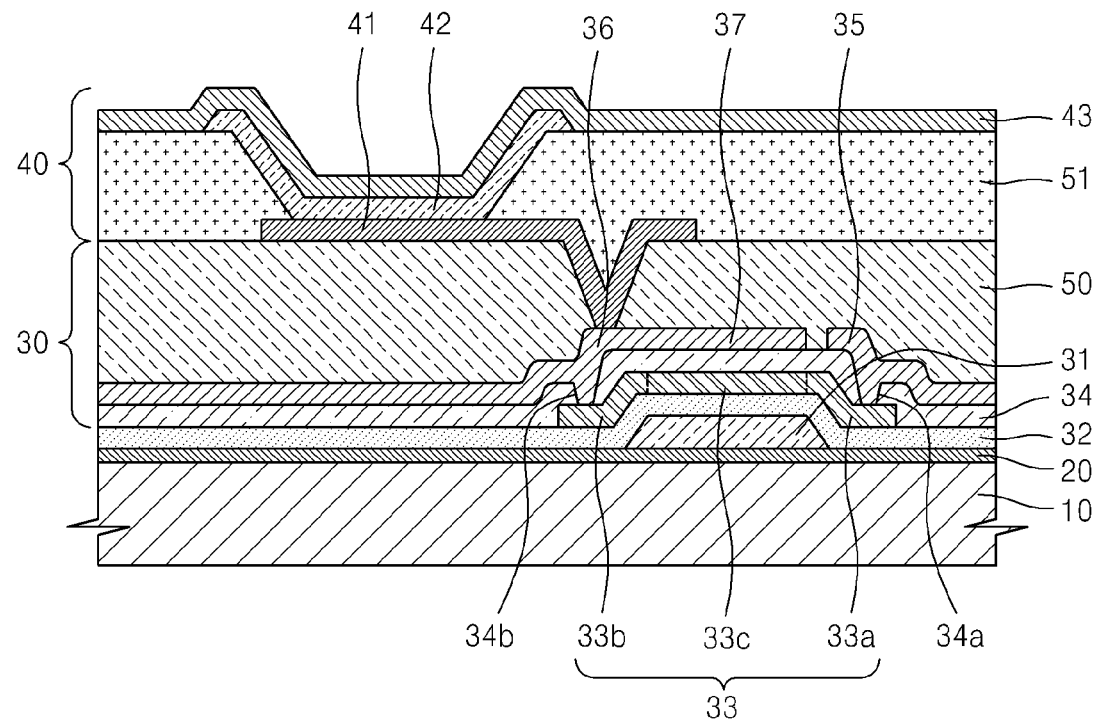
FIG. 1 is a cross-sectional view of an embodiment of an organic light-emitting display device.

FIG. 1 is a cross-sectional view of an embodiment of an organic light-emitting display device.

Referring to FIG. 1, the organic light-emitting display device includes a thin-film transistor (TFT) 30 and an organic light-emitting diode 40 on a substrate 10. In the organic light-emitting display device of FIG. 1, only one of a plurality of pixel regions is shown for convenience of illustration.

In the organic light-emitting diode 40, which is electrically connected to the TFT 30, light emission occurs. The organic light-emitting diode 40 in each pixel includes a pixel electrode 41, an opposite electrode 43 as a common electrode, and an organic emission layer 42 interposed between the pixel electrode 41 and the opposite electrode 43. As an appropriate voltage is applied between the pixel electrode 41 and the opposite electrode 43, the organic emission layer 42 emits light.

In a top-emitting organic light-emitting display device, in which an image is displayed toward the opposite electrode 43, the pixel electrode 41 may be a reflective electrode. In such embodiments, the pixel electrode 41 may include a reflective film formed of high-reflectivity metal, such as aluminum (Al), silver (Ag), or the like.

In some embodiments, when operating as an anode electrode, the pixel electrode 41 may include a layer formed of a metal oxide having a high-work function (in absolute value), for example, ITO, IZO, ZnO, or the like. In other embodiments, when operating as a cathode electrode, the pixel electrode 41 may be formed of a high-conductive metal having a low-work function (in absolute value), for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or the like.

In a top-emission organic light-emitting display device, the opposite electrode 43 may be a transparent electrode. In such embodiments, the opposite electrode 43 may include a semi-transparent film formed of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a compound of these materials, or may include a transparent metal oxide, for example ITO, IZO, ZnO, or the like. In some embodiments, when the pixel electrode 41 operates as an anode, the opposite electrode 43 operates as a cathode and vice versa. In a bottom-emission organic light-emitting display device, the opposite electrode 43 may be formed to have a reflection function by depositing silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or the like.

The organic emission layer 42 is disposed between the pixel electrode 41 and the opposite electrode 43. The organic emission layer 42 may include a light-emitting layer, and, in some embodiments, a hole injection-transport layer, an electron injection-transport layer, or a combination thereof.

Although not illustrated in the embodiment of FIG. 1, a protection layer may be further disposed on the opposite electrode 43, and the organic light-emitting display device may be sealed with a transparent substrate.

The TFT 30 may include a gate electrode 31 disposed on a buffer layer 20 of the substrate 10, a first insulating layer 32 covering the gate electrode 31, an active layer 33 disposed on the first insulating layer 32, a second insulating layer 34 disposed on the first insulating layer 32 to contact the active layer 33, and a source electrode 35 and a drain electrode 36 that are respectively connected to the active layer 33 via a first opening 34a and a second opening 34b of the second insulating layer 34.

The buffer layer 20, formed of an inorganic material, such as, for example, silicon oxide/silicon nitride, may be disposed on the substrate 10, to planarize the substrate 10.

The gate electrode 31 may include one or more layers of a conductive metal. In some embodiments, the gate electrode 31 may include molybdenum (Mo).

The first insulating layer 32, covering the gate electrode 31, may include, in some embodiments, silicon oxide, tantalum oxide, aluminum oxide, or the like.

The active layer 33 is disposed on the first insulating layer 32, and has a pattern. In various embodiments, the active layer 33 may include an amorphous oxide semiconductor, such as, for example, a G-I-Z-O layer [$(In_2O_3)a(Ga_2O_3)b(ZnO)c$ layer], wherein a, b, and c are real numbers that satisfy a≥0, b≥0, and c≥0. In some embodiments, the semiconductor may not necessitate a crystallization process The second insulating layer 34 is disposed to cover the active layer 33 and the first insulating layer 32. The second insulating layer 34 may include, in some embodiments, silicon oxide, tantalum oxide, aluminum oxide, or the like.

The source electrode 35 and the drain electrode 36, each of which includes a conductive metal, are disposed on the second insulating layer 34, so as to contact the active layer 33. In some embodiments, the conductive metal may include, for example, Al, Ag, Mg, Mo, Ti, W, or the like.

The source electrode 35 contacts a source region, which corresponds to a first region 33a of the active layer 33, and the drain electrode 36 contacts a drain region, which corresponds to a second region 33b of the active layer 33.

A third region 33c of the active layer 33 is disposed between the first region 33a and the second region 33b of the active layer 33. The third region 33c includes a channel region.

A third insulating layer 50 is disposed on the second insulating layer 34 to cover the source electrode 35 and the drain electrode 36. The pixel electrode 41 of the organic light-emitting diode 40 is disposed on the third insulating layer 50 to contact the drain electrode 36.

A pixel defining layer 51, exposing a portion of the pixel electrode 41, is disposed on the third insulating layer 50. The organic emission layer 42 and the opposite layer 43 are disposed on a portion of the pixel electrode 41 that is exposed by the pixel defining layer 51.

In the embodiment illustrated in FIG. 1, the pixel electrode 41 is connected to the drain electrode 36. In other embodiments, such as when the TFT 30 is of an N-type TFT, the pixel electrode 41 may be connected to the source electrode 35. In other embodiments, the pixel electrode 41 and the drain electrode 36 may be integrally constructed without the third insulating layer 50 therebetween.

In some embodiments, such as the one illustrated in FIG. 1, a dummy member 37 may be disposed on the second insulating layer 34. The dummy member 37 may be disposed to correspond to at least a portion of the third region 33c of the active layer 33. In some embodiments, the dummy member 37 may be disposed to fully cover the third region 33c.

The dummy member 37, which may be formed of a metal, may help prevent the penetration of water and oxygen into the third region 33c of the active layer 33.

In the embodiment illustrated in FIG. 1, the dummy member 37 extends from the drain electrode 36. In various embodiments, the dummy member 37 and the drain electrode 36 may be coplanar. The dummy metal 37 and the drain electrode 36 may formed of the same material at the same time, which may simplify a process for forming the dummy member 37. The connection of the dummy member 37 to the drain electrode 36 may lead to a further reduction in the resistance of the drain electrode 36.

In the embodiment described above, in which the dummy member 37 extends from the drain electrode 36, the dummy member 37 does not contact the source electrode 35.

In other embodiments, the dummy member 37 may extend from the source electrode 35. In such embodiments, the dummy member 37 does not contact the drain electrode 36.

The area of the dummy member 37 may be defined to be large enough to cover the third region 33c of the active layer 33.

Hereinafter, an embodiment of a method of manufacturing the embodiment of an organic light-emitting device of FIG. 1 will be described with reference to FIGS. 2A to 2H.

Figure 2A:
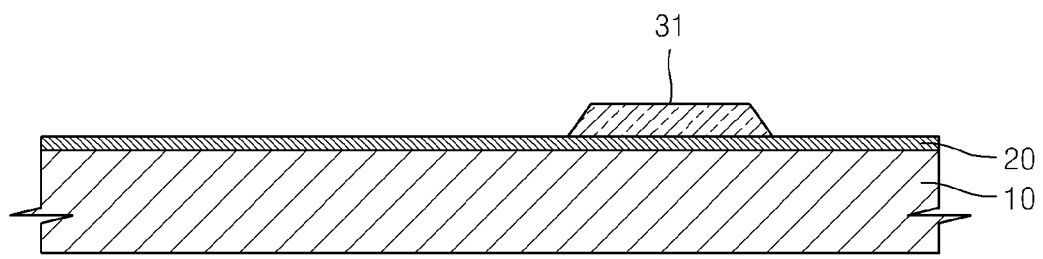
FIGS. 2A to 2H are cross-sectional views for describing an embodiment of a method of manufacturing the embodiment of an organic light-emitting display device of FIG. 1.

Referring to FIG. 2A, the gate electrode 31 of the TFT 30 is formed on the buffer layer 20 disposed on the substrate 10. The buffer layer 20 is optionally formed in some embodiments, and it planarizes the substrate 10.

Figure 2B:
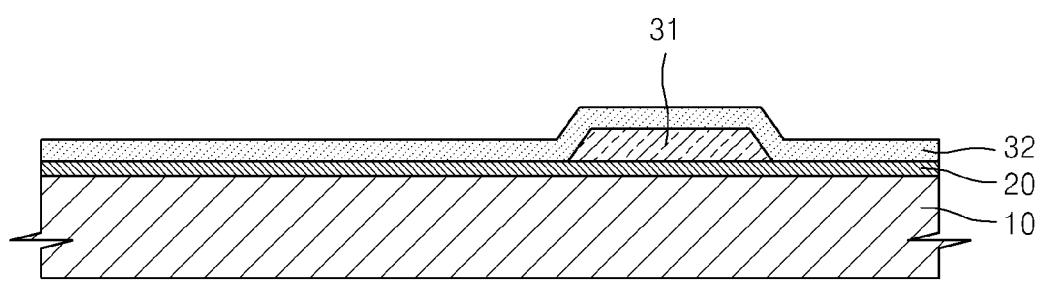

Referring to FIG. 2B, the first insulating layer 32 is formed to cover the gate electrode 31.

Figure 2C:
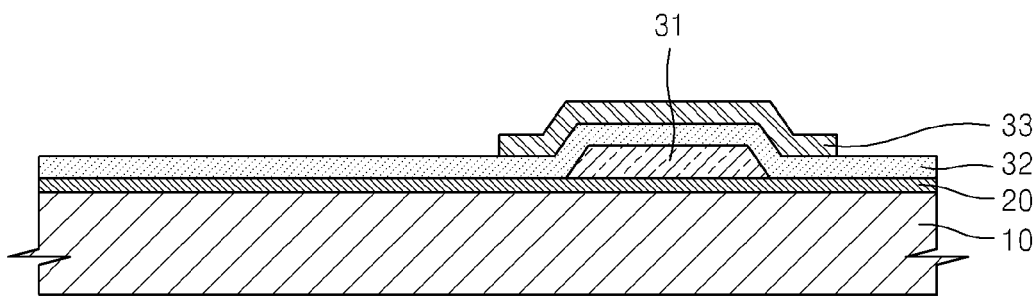

Referring to FIG. 2C, the active layer 33 is formed on the first insulating layer 32 to correspond to the gate electrode 31. In various embodiments, the active layer 33 may be formed of, for example, an oxide semiconductor.

Figure 2D:
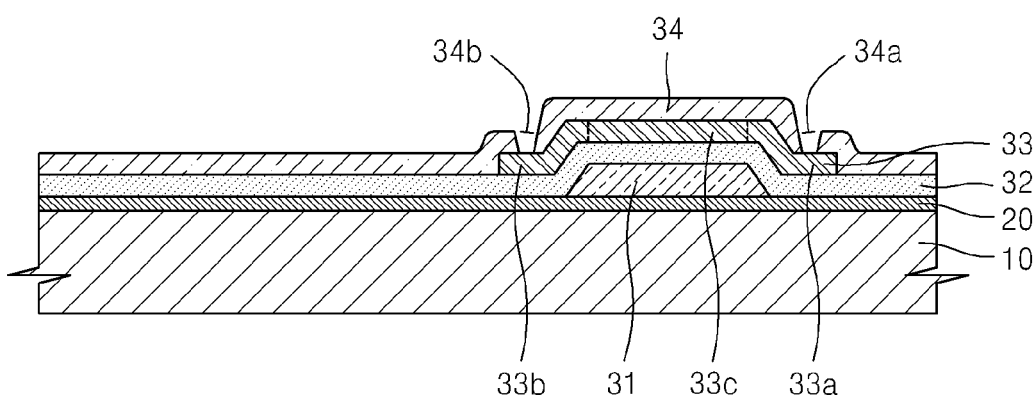

Referring to FIG. 2D, the second insulating layer 34 is formed on the active layer 33 and the first insulating layer 32. The first opening 34a and the second opening 34b are defined in the second insulating layer 34 to respectively expose the first region 33a and the second region 33b of the active layer 33.

Figure 2E:
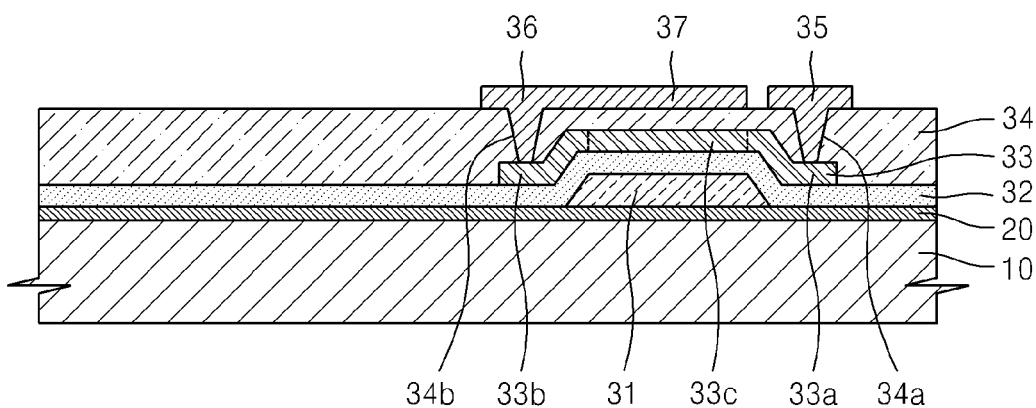

Referring to FIG. 2E, the source electrode 35 and the drain electrode 36 are formed on the second insulating layer 34, so as to be connected to the active layer 33 via the respective first and second openings 34a and 34b.

Figure 2F:
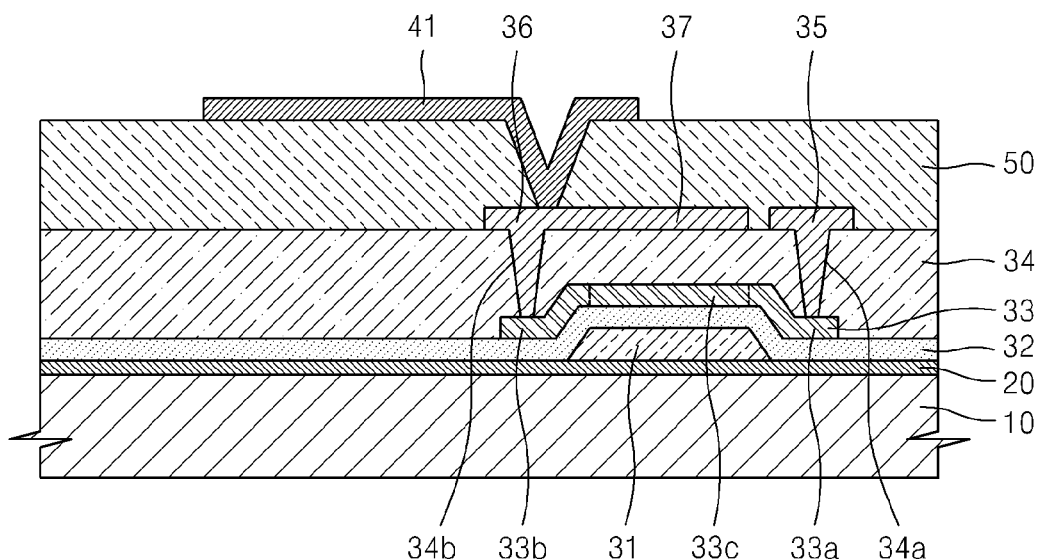
Figure 2G:
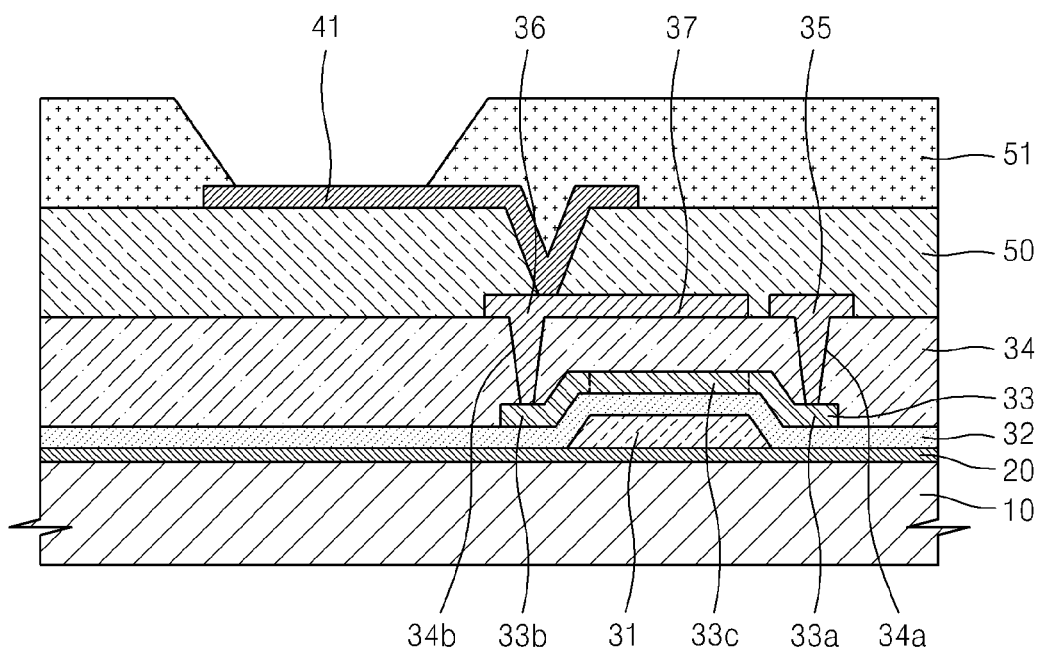

Referring to FIG. 2F, after the third insulating layer 50 is formed on the second insulating layer 34, the pixel electrode 41 is formed on the third insulating layer 50, so as to be connected to the drain electrode 36. Subsequently, the pixel defining layer 51, which defines pixels, is formed on the third insulating layer 50 and the pixel electrode 41, as illustrated in FIG. 2G.

Figure 2H:
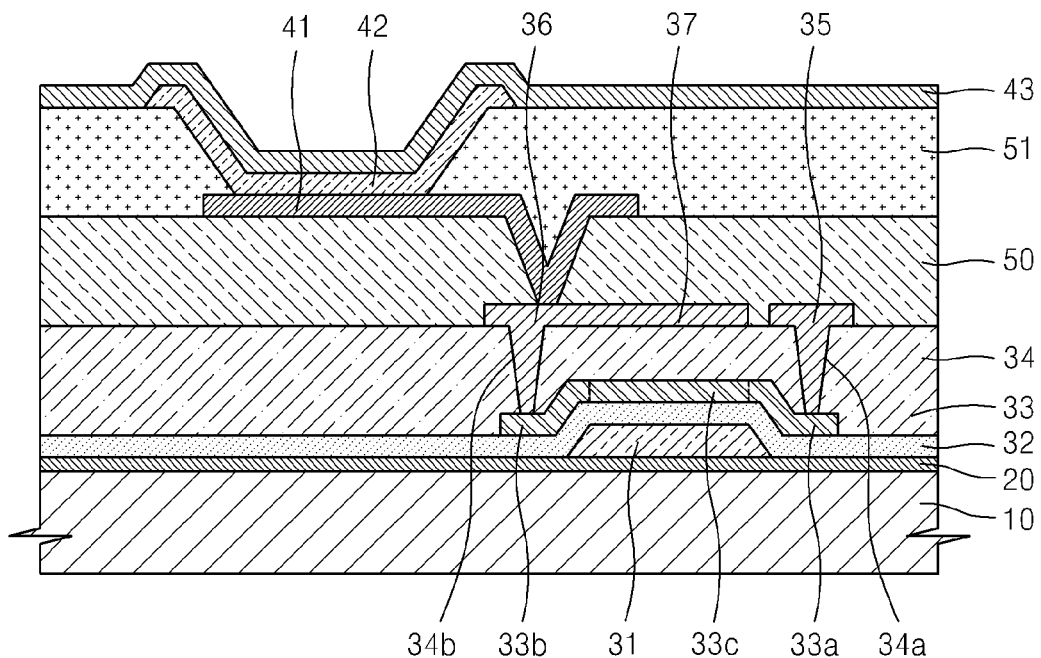

Referring to FIG. 2H, after the organic emission layer 42 is formed on the pixel electrode 41, the opposite electrode 43 is formed on the organic emission layer 42, thereby completing the manufacture of the organic light-emitting display device illustrated in FIG. 2H. Although not illustrated, in some embodiments, a protection layer may be formed on the opposite electrode 43, and the protection layer may be covered and sealed with a transparent substrate, such as, for example, a glass substrate.

In various embodiments of an organic light-emitting display device, the dummy member 37, made of metal, covers the active layer 33, to protect the active layer 33 from functional deterioration caused by the penetration of water and/or oxygen. Therefore, embodiments of the organic light-emitting display device may have an extended life span and may more stably display images.

Figure 3:
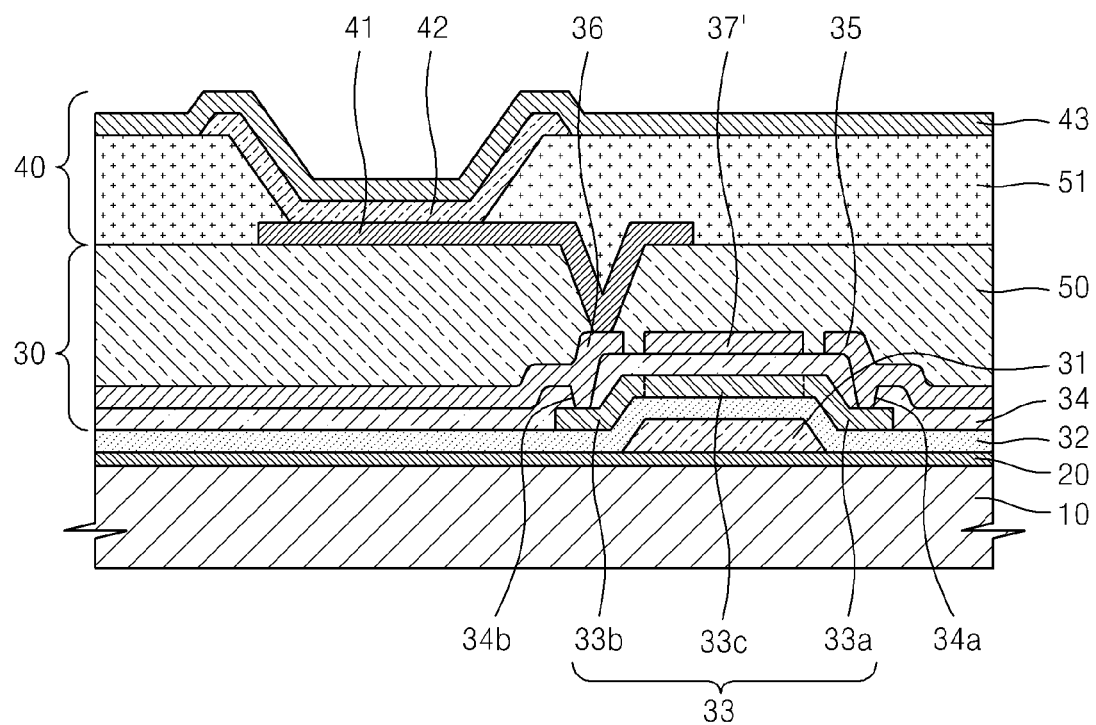
FIG. 3 is a cross-sectional view of another embodiment of an organic light-emitting display device.

FIG. 3 is a cross-sectional view of another embodiment of an organic light-emitting display device.

The embodiment of an organic light-emitting display device of FIG. 3 is substantially the same as the embodiment of FIG. 1, except that a dummy member 37', protecting the active layer 33, is separated from both the source electrode 35 and the drain electrode 36. In FIG. 3, elements with similar functions to those in FIG. 1 are denoted by like reference numerals for ease of understanding the structure of the organic light-emitting display device. A detailed description of those elements will not be provided to avoid redundancy.

Only the main differences of the organic light-emitting display device of FIG. 3 from that of FIG. 1 are described.

In the embodiment of FIG. 3, the dummy member 37' may form a secondary gate along with the gate electrode 31 by being connected with a signal line or the gate electrode 31.

When the active layer 33 is formed of an oxide semiconductor, due to low mobility characteristics of the TFT 30, the organic light-emitting display device may not operate at high frequencies for displaying high-resolution or 3-dimensional (3D) images.

In the embodiment of FIG. 3, the dummy member 37', which may form a secondary gate with the gate electrode 31 without an additional process, may further improve the mobility characteristics of the TFT 30.

In another embodiment, the dummy member 37' may be floated, not connected with any signal line or the gate electrode 31, to function only as a protective layer for the active layer 33.

As described above, according to the one or more embodiments, a dummy member may be disposed to cover at least a channel region of an active layer to protect the active layer from moisture or oxygen permeation, and thus prevent functional degradation of the active layer. Therefore, this structure may increase the lifespan of a device and may enable to more stably display images.

The dummy member may function as a secondary gate along with a gate electrode, and thus may improve mobility characteristics of a TFT.

While the present invention has been particularly shown and described with reference to certain embodiments thereof, it will be understood by those of ordinary skill in the art that various changes in form and details may be made therein without departing from the spirit and scope of the present invention as defined by the following claims.

What is claimed is:

1. An organic light-emitting display device comprising:
a thin-film transistor comprising:
a gate electrode disposed on a substrate;
a first insulating layer disposed on the gate electrode;
an active layer disposed on the first insulating layer and corresponding to the gate electrode;
a second insulating layer disposed on the first insulating layer and covering the active layer, the second insulating layer comprising first and second openings exposing first and second portions of the active layer, respectively;
a source electrode disposed on the second insulating layer and connected to the first portion of the active layer via the first opening of the second insulating layer;
a drain electrode coplanar with the source electrode, said drain electrode disposed on the second insulating layer and connected to the second portion of the active layer via the second opening of the second insulating layer;
a dummy member disposed on the second insulating layer, the dummy member extending from at least one of the source electrode and the drain electrode, coplanar with the source electrode and the drain electrode, and disposed to correspond to at least a third portion of the active layer between the first and second portions of the active layer, wherein only the second insulating layer is located between the dummy member and the third portion;
a third insulating layer disposed on the second insulating layer and covering the source electrode, the drain electrode and the dummy member, and an organic light-emitting device electrically connected to at least one of the source electrode and the drain electrode.

2. The organic light-emitting display device of claim 1, wherein the dummy member comprises a metal.

3. The organic light-emitting display device of claim 2, wherein the dummy member comprises a same material as at least one of the source electrode and the drain electrode.

4. The organic light-emitting display device of claim 1, wherein the third portion comprises a channel region of the active layer, and the dummy member covers the channel region of the active layer.

5. The organic light-emitting display device of claim 1, wherein the active layer comprises an oxide semiconductor.

\* \* \* \* \*